United States Patent [19]
Zambre

[11] 3,956,644
[45] May 11, 1976

[54] INTEGRAL CYCLE, PRECISE ZERO VOLTAGE SWITCH

[75] Inventor: Bhagvantrao G. Zambre, Palo Alto, Calif.

[73] Assignee: Elma Engineering, Palo Alto, Calif.

[22] Filed: Oct. 10, 1974

[21] Appl. No.: 513,719

[52] U.S. Cl. .................... 307/252 UA; 307/235 E
[51] Int. Cl.² .................. H03K 17/06; H03K 5/153
[58] Field of Search ............... 307/252 UA, 235 E

[56] References Cited
UNITED STATES PATENTS

| | | | |
|---|---|---|---|
| 3,506,852 | 4/1970 | Hart | 307/252 UA |
| 3,633,094 | 1/1972 | Clements | 307/252 UA |
| 3,657,565 | 4/1972 | Leyten | 307/252 UA |

Primary Examiner—John S. Heyman
Attorney, Agent, or Firm—Limbach, Limbach & Sutton

[57] ABSTRACT

Alternating current from a source is supplied to a load through a thyristor whose gate electrode is controlled by the output from a zero voltage switch. The zero voltage switch is enabled by the output of a flip-flop beginning at the simultaneous occurrence of a command input and a clock signal input to the flip-flop. The clock signal input is generated just before the beginning of each half cycle of a predetermined polarity of the alternating current so that integral cycling is achieved without delayed switching which would produce current spikes.

5 Claims, 8 Drawing Figures

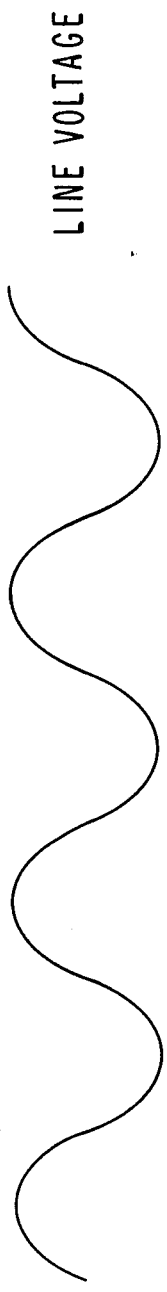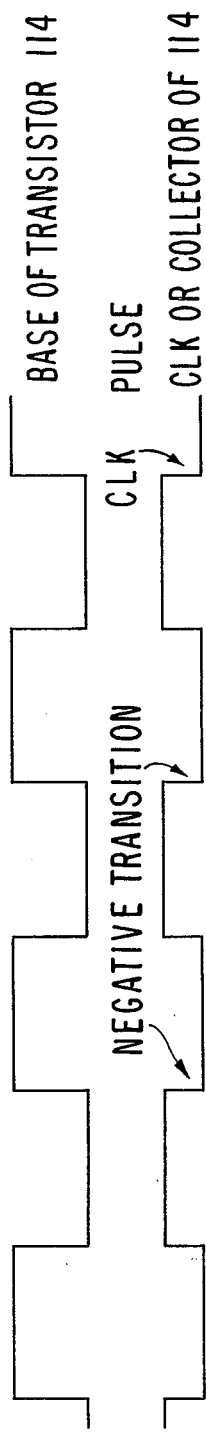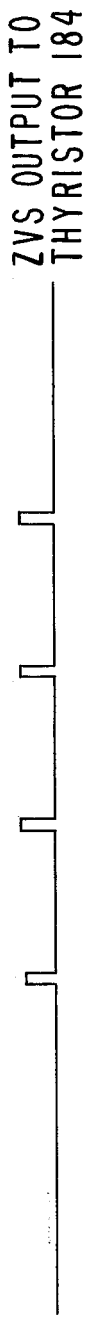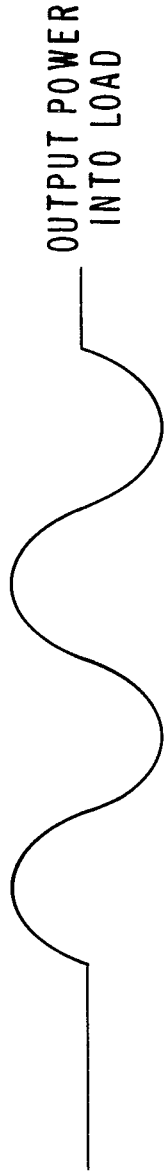
FIG.2A  LINE VOLTAGE
FIG.2B  BASE OF TRANSISTOR 114
FIG.2C  CLK PULSE — CLK OR COLLECTOR OF 114
FIG.2D  D INPUT
FIG.2E  Q OUTPUT OF FF 102 OR ZVS ENABLE
FIG.2F  ZVS OUTPUT TO THYRISTOR 184
FIG.2G  OUTPUT POWER INTO LOAD

INTEGRAL CYCLE, PRECISE ZERO VOLTAGE SWITCH

BACKGROUND OF THE INVENTION

In one type of power control operation, power from an alternating current source to a load is switched on or off at approximately the instant when the power source is at zero volts. Since the switching is done essentially at zero energy, this type of control substantially minimizes radio frequency interference caused by transient current pulses or "spikes." Many devices of this type, however, actually turn the power on slightly after the zero crossing of the alternating current source which does produce radio frequency interference. In some operations it is also necessary that such switching controls turn on the alternating current source for the duration of a whole cycle, that is, for an integral cycle. If this is not done, then an odd number of alternating current half cycles will result, which cumulatively produce a DC component to cause possible damage to the inductive components in a load, for example. Further disadvantages of many prior art zero voltage switching controls are that they often require the use of complicated, bulky or expensive circuitry.

SUMMARY OF THE INVENTION

The above and other disadvantages of prior art zero voltage switching control systems are overcome by the present invention of an integral cycle, precise zero voltage switch for supplying alternating current from an external source to a load including means for generating a command signal, means for generating a clock signal just before the beginning of each half cycle of a predetermined polarity of the alternating current, and bistable logic means responsive to the command and clock signals for producing a logic signal beginning at the simultaneous occurrence of the command and clock signals and ending with the occurrence of the clock signal alone. Zero voltage switching means supply alternating current to the load, beginning and ending from the zero crossing of the alternating current, whenever the zero voltage switching means is enabled by the logic signal. In the preferred embodiment, the zero voltage switching means includes a thyrister whose control electrode is supplied with the output of a zero voltage switch which is enabled by the logic signal. In other embodiments other types of electronic switches may be substituted for the thyrister.

In the preferred embodiment, the means for generating a clock signal include a transistor whose base control electrode is coupled to the alternating current source through a diode in a manner such that the collector electrode of the transistor produces a negative going clock pulse just before the positive going transition about the zero voltage level of the alternating current cycle. This clock signal is fed to the input of a flip-flop which constitutes the bistable logic means so that the command signal when applied to the other input of the flip-flop will be transferred to the flip-flop output if the clock signal simultaneously occurs. The use of a flip-flop ensures integral cycling and the use of a zero voltage switch to drive the gate electrode of the thyristor ensures that the thyristor will have a hard turn on at the zero voltage level rather than be delayed in its turn on as in some prior art embodiments which produce current spikes.

The circuit of the present invention precisely produces integral cycles only at the zero crossing of the alternating current source, beginning at the positive half cycle and completing the negative half cycle. It creates no cumulative D.C. component and no radio frequency interference spikes and will operate at any power frequency from below 50 cycles to above 400 cycles. This is in contrast to some prior art devices which utilize reactive components which introduce a frequency limitation to the circuit. The manufacturing cost of the circuit of the invention is approximately one-third the cost of similar prior art circuits and requires no large discrete components.

It is therefore an object of the present invention to provide a zero voltage switch control circuit which supplies alternating current power to a load in integral cycles while creating no radio frequency interference.

It is another object of the invention to provide a zero voltage switch control which will operate over a wide range of power frequencies.

It is still another object of the invention to provide a low-cost, zero voltage switching control circuit.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWING

FIGS. 2A-2G are wave form diagrams for use in explaining the operation of the invention.

DETAILED DESCRIPTION OF THE PREFERRED EMBODIMENT OF THE INVENTION

Figure 1:
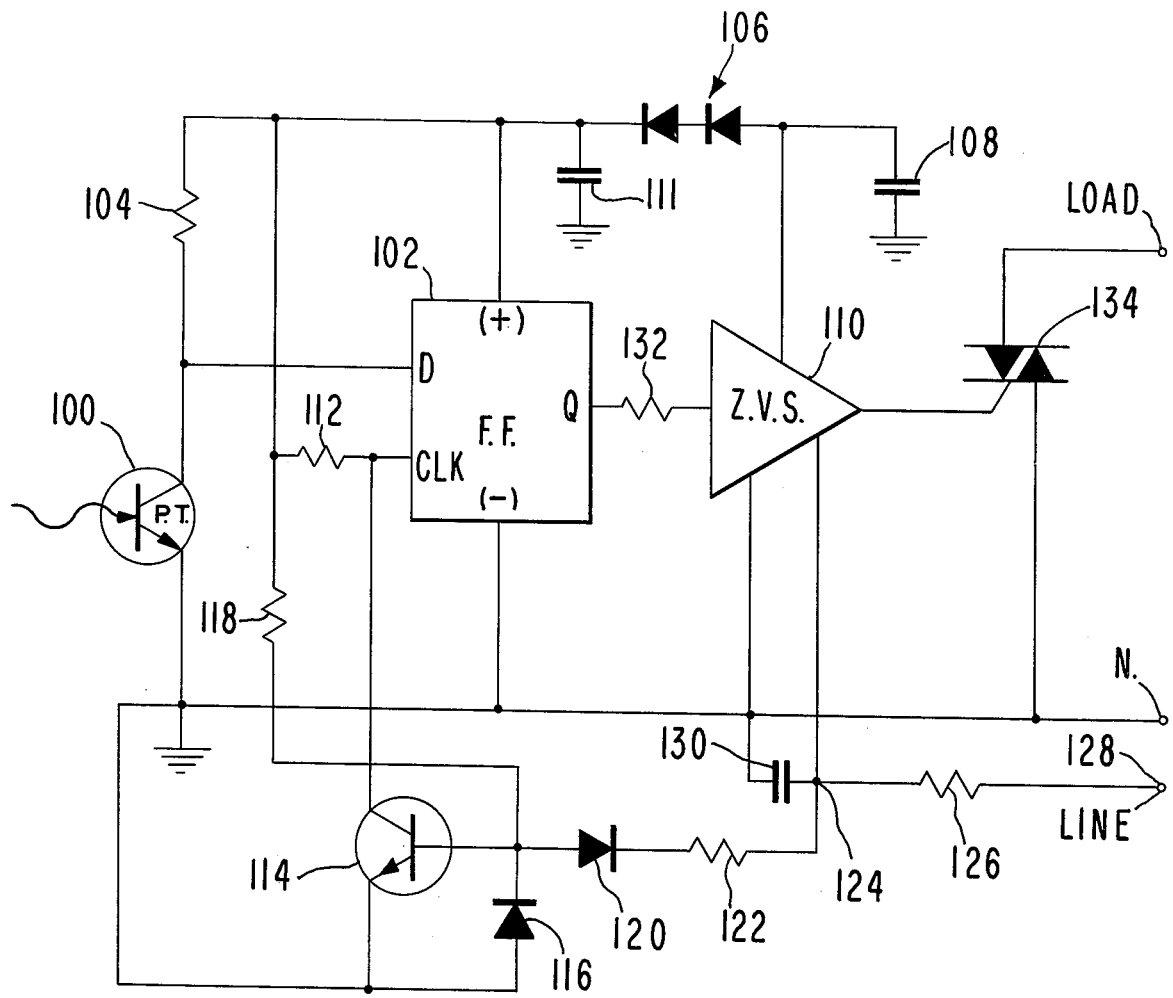
FIG. 1 is a schematic circuit diagram of the invention.

Referring now more particularly to FIG. 1 there is shown a phototransistor 100 which receives power command information in the form of light pulses generated by an external sensing circuit (not shown). The purpose of the phototransistor is, of course, to provide circuit isolation. The emitter of the transistor 100 is connected to the circuit ground and its collector electrode is connected to the D input of a flip-flop (F.F.) 102 and through a resistor 104 to the cathode electrode of a dual diode 106. The anode electrode of the diode 106 is connected through a capacitor 108 to the circuit ground and is also connected directly to one input of a zero voltage switch (Z.V.S.) 110. The cathode electrode of the dual diode 106 is also connected to the positive power supply input of the flip-flop 102 and is connected to the circuit ground through a capacitor 111. The dual diode 106 acts as voltage dropping device to provide plus 5 volts power supply to the flip-flop, transistors 100 and 114.

The cathode of the dual diode 106 is connected through a resistor 112 to the clock (CLK) input of the flip-flop 102. The CLK input is connected to the collector electrode of an NPN transistor 114 whose emitter electrode is connected to the circuit ground and to the anode electrode of a diode 116. The cathode electrode of the diode 116 is connected to the base electrode of the transistor 114 and is also connected through a resistor 118 to the cathode electrode of the dual diode 106.

The base electrode of the transistor 114 is connected to the anode electrode of a diode 120 whose cathode electrode is connected through a resistor 122 to a terminal point 124. The dual diode 106 supplies D.C. power to the transistors 100, 114 and the flip-flop 102. The diode 120 supplies a synchronizing signal to the transistor 114. The transistor 114 supplies the CLK signal in synchronism with the external alternating current source, as will be explained in greater detail hereinafter.

The terminal point 124 is connected through a resistor 126 to a LINE terminal 128. The circuit ground is connected to the negative (−) power supply input of the flip-flop 102 and to the zero voltage switch 110 as well as to a line Neutral terminal (N). The zero voltage switch 110 is also connected by one input to the terminal 124. A capacitor 130 is connected between the terminal 124 and the circuit ground. An external alternating current source (not shown) is applied between the terminals 128 and N. See FIG. 2A.

An output terminal Q of the flip-flop 102 is connected through a resistor 132 to the enabling input of the zero voltage switch 110. The output of the zero voltage switch 110 is connected to the gate electrode of a thyrister 134 which is connected between the circuit ground and a load (not shown). The load is typically connected in series with, for example, an on-off switch (not shown) and the external alternating current source so that the conductivity state of the thyrister 134 will control whether power is to be applied to the load.

In operation, an output signal from the collector of the phototransistor 100 is applied to the input D of the flip-flop 102 as a command signal whenever it is desired to supply power to the load. Such a command signal can be representative of the output of a sensor which monitors the load. For example, if the load is a heating element the command signal can represent the output of a temperature sensor. See FIG. 2D.

In order to make sure that the thyrister 134 is only enabled at the beginning of each half cycle of the predetermined polarity of the alternating current applied across the terminals 128 and N, a bistable memory unit in the form of the flip-flop 102 is used and this flip-flop is keyed in part by the CLK signal from the transistor 114. The transistor 114 produces a negative transition CLK signal only at the positive transition about zero of the power cycle of the alternating current applied between the terminals 128 and N, that is, the CLK signal is generated just prior to the beginning of the positive half cycle of the alternating current. See FIG. 2C.

The command signal at the D flip-flop input will be transferred to the Q output of the flip-flop 102 only if it is present just before the zero crossing of only positive going half cycles of the alternating current, that is, it must be synchronous with the CLK or negative transition of the collector of the transistor 114. The presence or absence of this logic signal appearing at the Q output terminal enables or disables, respectively, the zero voltage switch 110 just before the beginning of the positive half cycle of the alternating current source. See FIG. 2E. The zero voltage switch 110 produces output pulses symmetrically spaced around the zero crossing of the alternating current in even numbers and these pulses are supplied to the gate electrode of the thyrister 134. See FIG. 2F.

The gate electrode of the thyrister 134 is thereby affirmatively energized just before the zero crossing and just after the zero crossing of the alternating current, thus assuring a hard turn on and latching of the thyrister 134 at the zero crossing. This is in contrast to some prior art circuits in which there is no power applied to the gate electrode just before the zero crossing or just after the zero crossing which causes an undesirable delay in turning on the thyrister with the result that R.F.I. spikes are produced.

Assuming that the command signal at the D input of the flip-flop 102 ceases, as for example during a negative half cycle of the alternating current in which the thyrister 134 is conductive, then the CLK signal applied at the positive transition about zero of the next succeeding power cycle will reset the flip-flop 102 and transfer a signal, or rather the absence of a command signal to the Q output of the flip-flop 102 which disables the zero voltage switch 110 and no pulses will be applied to the gate electrode of the thyrister 134. The thyrister 134 will thus become nonconductive precisely as the alternating current passes through the zero voltage level. See FIG. 2G.

While in the above described embodiment the clock signal has been described as synchronized with the positive transition about zero of the alternating current, it should be apparent that in other embodiments the clock signal can be synchronized with the negative transition about zero of the alternating current. Furthermore, although the thyrister 134 is depicted in FIG. 1 as a triac, the use of other types of thyristers should be understood and the thyrister 134 is only intended to be all suitable types of electronic power switching devices.

The terms and expressions which have been employed here are used as terms of description and not of limitation, and there is no intention, in the use of such terms and expressions, of excluding equivalents of the features shown and described, or portions thereof, it being recognized that various modifications are possible within the scope of the invention claimed.

What is claimed is:

1. An integral cycle, precise zero voltage switch for supplying alternating current from an external source to a load comprising
    means for generating a command signal,
    means for generating a clock signal just before the beginning of each half cycle of a predetermined polarity of the alternating current,
    bistable logic means responsive to the command and clock signals for producing a logic signal beginning at the simultaneous occurrence of the command and clock signals and ending with the occurrence of the clock signal alone, and
    switching means for supplying the alternating current to the load beginning and ending from the zero crossing of the alternating current and provided that the switching means is enabled by the logic signal.

2. An integral cycle, precise zero voltage switch as recited in claim 1 wherein the switching means comprises a gate controlled switch connected in series with the load and the alternating current source and a zero voltage switch controlled by the logic signal and the alternating current and having an output connected to the gate electrode of the gate controlled switch.

3. An integral cycle, precise zero voltage switching control for use with a load and a source of alternating current comprising
    clock means responsive to the alternating current for producing a clock pulse just before the positive going transition about the zero voltage level of the alternating current, means for supplying a switching command signal, bistable logic means responsive to both the clock pulse and the command signal for producing a logic signal beginning just before the positive half cycle of the alternating current and extending for a complete cycle of the alternating current, provided that the bistable logic means simultaneously receives a command signal and a clock pulse, and zero voltage switch means which is enabled by the logic signal and which conducts alternating current from the source to the load beginning and ending at the zero voltage crossings of the alternating current in response to the logic signal.

4. An integral cycle, precise zero voltage switching control as recited in claim 3 wherein the bistable logic means includes a flip-flop having a first input to which the command signal is applied, a second input to which the clock signal is applied, and an output from which the logic signal is derived, the logic signal output being representative of the command signal during a period of time beginning with the simultaneous occurrence of the command and clock signals and ending with the occurrence of the clock signal alone.

5. An integral cycle, precise zero voltage switching control as recited in claim 4 wherein the zero voltage switch means includes a zero voltage switch which, when enabled by the logic signal, produces even numbers of output pulses symmetrically around the zero voltage crossings of the alternating current, and gate controlled switching means connected in series with the load and the source of alternating current with the gate of the gate controlled switching means being supplied with the output pulses of the zero voltage switch to render it conductive.

* * * * *